US009435861B2

(12) United States Patent
Elkin et al.

(10) Patent No.: US 9,435,861 B2
(45) Date of Patent: Sep. 6, 2016

(54) EFFICIENT SCAN LATCH SYSTEMS AND METHODS

(71) Applicant: NVIDIA Corporation, Santa Clara, CA (US)

(72) Inventors: Ilyas Elkin, Sunnyvale, CA (US); Ge Yang, Dublin, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 28 days.

(21) Appl. No.: 13/663,379

(22) Filed: Oct. 29, 2012

(65) Prior Publication Data

US 2014/0122949 A1    May 1, 2014

(51) Int. Cl.
*G01R 31/28* (2006.01)
*G01R 31/3185* (2006.01)
*G01R 31/3177* (2006.01)

(52) U.S. Cl.
CPC ....... *G01R 31/318541* (2013.01); *G01R 31/28* (2013.01); *G01R 31/3177* (2013.01); *G01R 31/318536* (2013.01); *G01R 31/318533* (2013.01); *G01R 31/318544* (2013.01); *G01R 31/318555* (2013.01); *G01R 31/318572* (2013.01)

(58) Field of Classification Search
CPC ............. G01R 31/318536; G01R 31/318541; G01R 31/318572; G01R 31/318544; G01R 31/318533; G01R 31/318555; G01R 31/3177; G01R 31/28
USPC ................. 714/726, 727, 728, 729
See application file for complete search history.

(56) References Cited

U.S. PATENT DOCUMENTS

| | | | |
|---|---|---|---|
| 4,256,411 A | 3/1981 | Podosek | |
| 5,821,791 A | 10/1998 | Gaibotti et al. | |
| 5,903,171 A | 5/1999 | Shieh | |
| 6,310,501 B1 | 10/2001 | Yamashita | |
| 6,396,309 B1 | 5/2002 | Zhao et al. | |
| 6,442,721 B2 * | 8/2002 | Whetsel | 714/726 |
| 6,472,920 B1 | 10/2002 | Cho et al. | |
| 6,580,411 B1 | 6/2003 | Kubota et al. | |
| 6,630,853 B1 | 10/2003 | Hamada | |
| 6,714,060 B2 | 3/2004 | Araki | |
| 6,747,485 B1 | 6/2004 | Suryanarayana et al. | |
| 7,057,421 B2 | 6/2006 | Shi et al. | |
| 7,196,552 B2 | 3/2007 | Zhou | |
| 7,304,903 B2 | 12/2007 | Mukhopadhyay et al. | |
| 7,405,606 B2 | 7/2008 | Kok et al. | |
| 7,418,641 B2 * | 8/2008 | Drake et al. | 714/726 |
| 7,760,117 B1 | 7/2010 | Chou | |

(Continued)

FOREIGN PATENT DOCUMENTS

JP         2004214997       7/2004

*Primary Examiner* — Esaw Abraham
*Assistant Examiner* — Osman Alshack

(57) ABSTRACT

Systems and methods for latches are presented. In one embodiment a system includes scan in propagation component, data propagation component, and control component. The scan in propagation component is operable to select between a scan in value and a recirculation value. The data propagation component is operable to select between a data value and results forwarded from the scan in propagation component, wherein results of the data propagation component are forwarded as the recirculation value to the scan in propagation component. The control component is operable to control an indication of a selection by the scan in propagation component and the data propagation component.

14 Claims, 15 Drawing Sheets

(56) References Cited

U.S. PATENT DOCUMENTS

| | | |
|---|---|---|
| 8,742,796 B2 | 6/2014 | Dally et al. |
| 2004/0160244 A1 | 8/2004 | Kim |
| 2004/0243896 A1* | 12/2004 | Jaber et al. ............ 714/726 |
| 2005/0040856 A1 | 2/2005 | Ramaraju et al. |
| 2005/0108604 A1* | 5/2005 | Wong ...................... 714/726 |
| 2006/0049852 A1 | 3/2006 | Park et al. |
| 2007/0028157 A1* | 2/2007 | Drake et al. ............ 714/797 |
| 2007/0146033 A1 | 6/2007 | Pesci |
| 2008/0086667 A1* | 4/2008 | Chen et al. ............ 714/731 |
| 2008/0195337 A1* | 8/2008 | Agarwal et al. ........ 702/75 |
| 2008/0270862 A1* | 10/2008 | Drake et al. ............ 714/731 |
| 2010/0102890 A1* | 4/2010 | Stratz et al. ............ 331/44 |
| 2010/0109707 A1 | 5/2010 | Srivastava et al. |
| 2010/0332924 A1* | 12/2010 | Ziaja et al. ............. 714/718 |
| 2011/0066904 A1* | 3/2011 | Lackey .................... 714/726 |

* cited by examiner

400

410
Receiving a scan enable indication.

420
Selecting between a scan input and a recirculation value before choosing between a corresponding data input and results of the selecting.

430
Choosing between the corresponding data input and the results of the selecting.

FIGURE 4

EFFICIENT SCAN LATCH SYSTEMS AND METHODS

FIELD OF THE INVENTION

The present invention relates to electronic circuits. In particular, the present invention relates to a system and method for efficient scan latch operations.

BACKGROUND OF THE INVENTION

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data in most areas of business, science, education and entertainment. The manner in which the electronic devices perform operations can have a significant impact on performance and end results and testing device performance is often important. However, conventional approaches to testing component operations can have many limitations and can be very complex and complicated.

Traditional scan flip flops are used in many kinds of integrated circuits for various testing purposes (e.g., in order to test chips for defects). The traditional approaches often use inputs derived by automatic test pattern generation (ATPG). Both tester time and test escapes which are packaged and later discarded present a significant cost to integrated circuit manufacturers. Some traditional approaches attempt to mitigate this by adding test features to chips to enable quick and reliable testing. In a modern processor, that often means that a majority of flip flops have scan features, which typically allows ATPG patterns to be shifted in from flip-flop to flip-flop in order to provide inputs for test and then captured test results to be shifted out for comparison with expected values. In some conventional mux-scan methods, scan testing utilizes a scan mux in the flip flop, which typically selects either between data input in functional mode or scan input in scan shift mode, based on a scan enable signal acting as a select. FIG. 1A is a block diagram of a prior art scan latch system, including selectors 110 and 120 and control component 130. FIG. 1 B is an illustration of a prior art scan master slave flip flop approach utilizing the master latch system of FIG. 1A. FIG. 2A is a block diagram of another prior art scan latch system with gated clock, including selector 220 and control component 230. FIG. 2B is an illustration of another prior art scan master slave flip flop approach utilizing the master latch system of FIG. 2A.

In recent years there has been an increased focus on power consumption and some conventional approaches try to reduce the usage of high power fast dynamic and sense amplifier flip flops in favor of static flip flops. However, static master slave flip flops are usually slower than dynamic topologies and there has been increased focus on improving the speed of static flip flops so they can better serve as replacements to dynamic and sense amplifier flip flops in critical paths. In some prior art designs, the select to the scan mux are gated by a clock (e.g., to take the clocked transmission gate out of the critical path) in an attempt to improve speed. In those prior art designs, the scan multiplexor is still put in the critical data path of the flip flop, which adds extra diffusion and parasitic loads to the critical path, typically resulting in additional delay overhead for the flip flop, even when the flip flop is not used for scan.

SUMMARY

Systems and methods for latches are presented. In one embodiment a system includes scan in propagation component, data propagation component, and control component. The scan in propagation component is operable to select between a scan in value (SI) and a recirculation value. The data propagation component is operable to select between a data value and results forwarded from the scan in propagation component, wherein results of the data propagation component are forwarded as the recirculation value to the scan in propagation component. The control component is operable to control an indication of a selection by the scan in propagation component and the data propagation component.

DESCRIPTION OF THE DRAWINGS

The accompanying drawings, which are incorporated in and form a part of this specification, illustrate embodiments of the invention by way of example and not by way of limitation. The drawings referred to in this specification should be understood as not being drawn to scale except if specifically noted.

FIG. 4 is an exemplary scan latch method in accordance with one embodiment of the present invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Presented systems and methods can facilitate efficient data and scan operations. In one embodiment, the systems and methods can address various concerns by reducing delay on the data input and increasing delay on the scan input by reordering scan in selection and recirculation or keeper selection in a way that makes the load of the scan in selection invisible to the critical path during functional mode data input propagation. In one exemplary implementation, the reordering also results in additional series transistors on the scan input propagation, which slows down the scan input path and improves its hold time. Some embodiments of the invention also reduces or saves transistors over conventional gated mux flop prior art approaches by using an ungated clock to select between scan input and stored master node value to drive the recirculation keeper. This can be used to reduce design area.

Figure 1A:
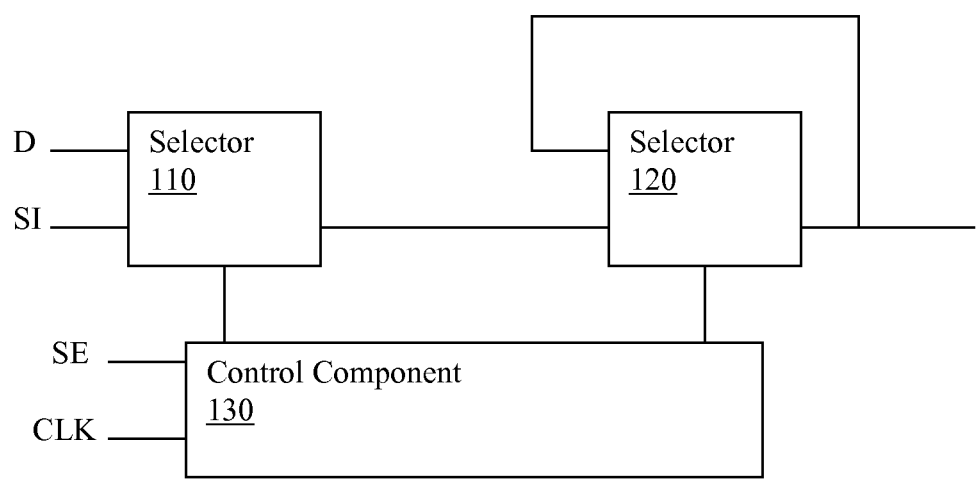
FIGS. 1A and 1B are illustrations of one prior art scan latch system, and a corresponding prior art master slave flip flop approach, respectively.
Figure 1B:
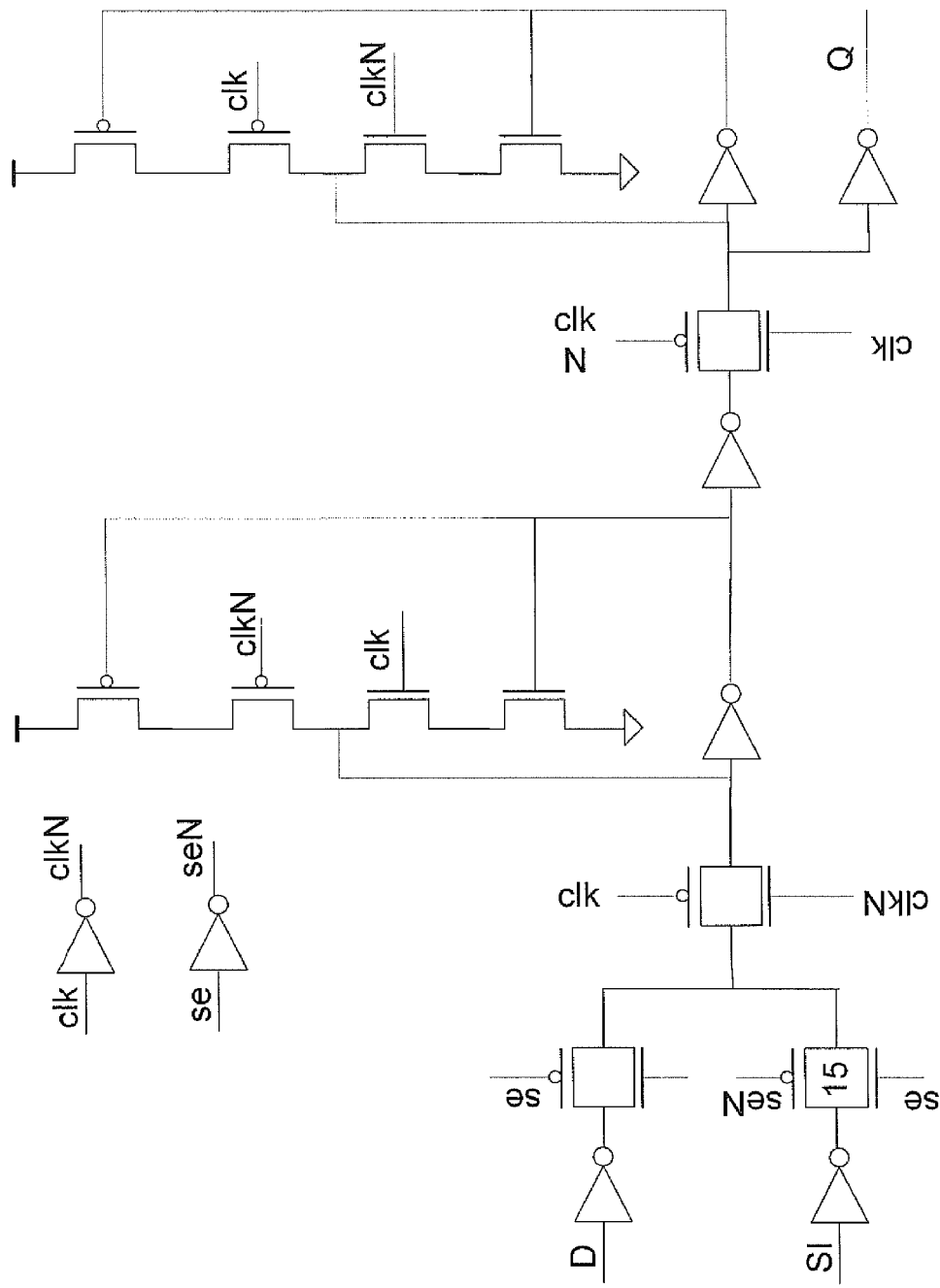
Figure 2A:
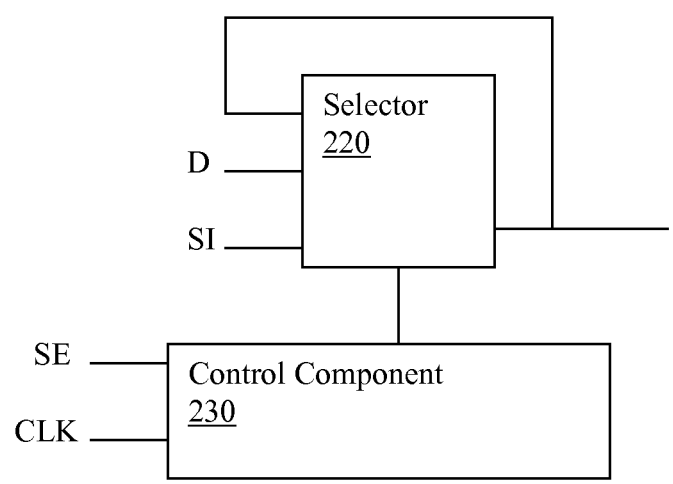
FIGS. 2A and 2B are illustrations of another prior art scan latch system with gated clock, and a corresponding prior art master slave flip flop approach, respectively.
Figure 2B:
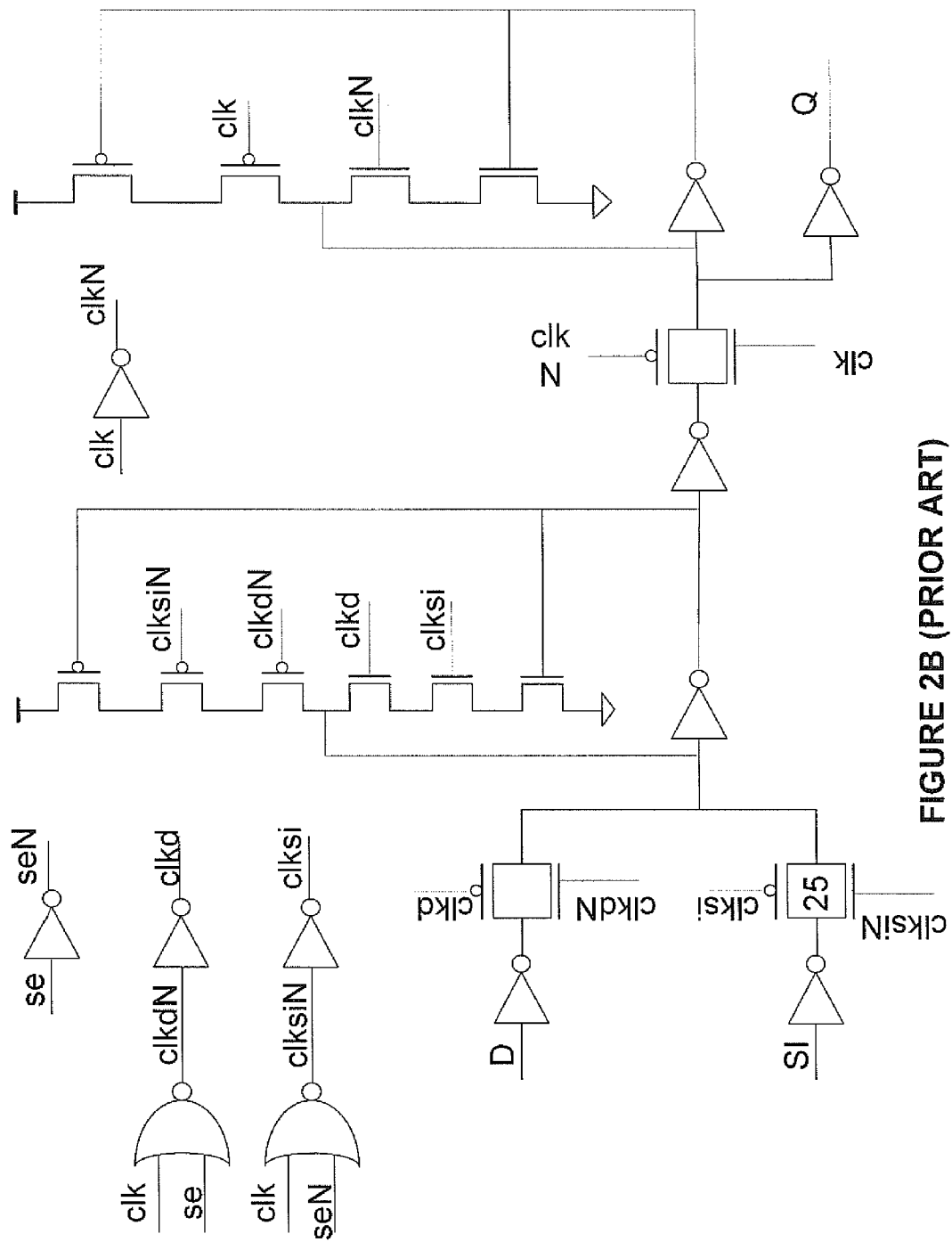
Figure 3:
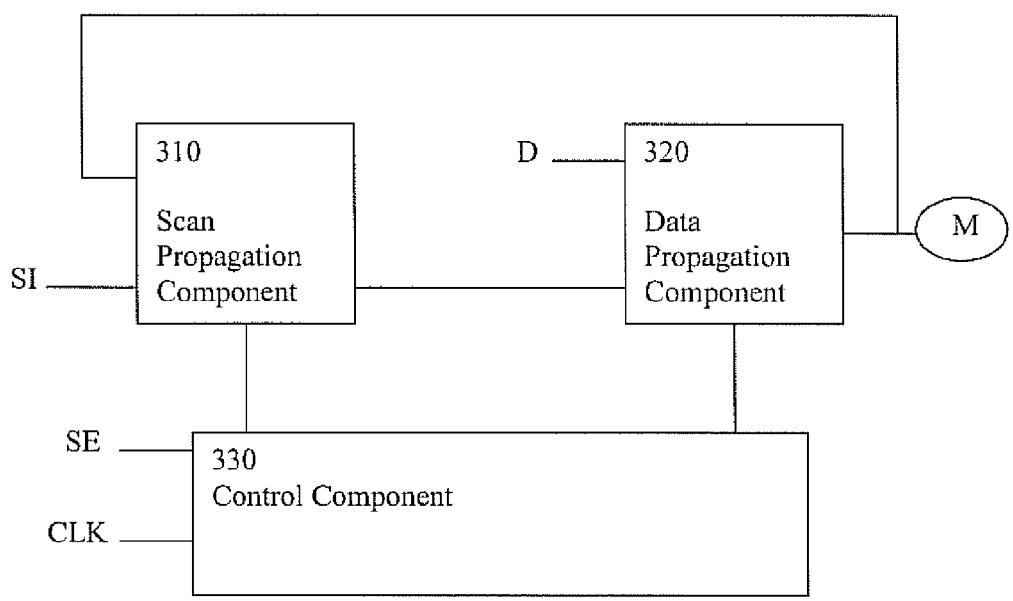
FIG. 3 is a block diagram of an exemplary scan latch system in accordance with one embodiment of the present invention.

FIG. 3 is a block diagram of exemplary latch system 300 in accordance with one embodiment of the present invention. Latch system 300 includes scan in propagation component 310, data propagation component 320 and control component 330. Control component 330 is coupled to scan in propagation component 310 and data propagation component 320. In one embodiment, one input of scan in propagation component 310 is a scan input, one input of scan in propagation component 310 is a recirculation value and the output of scan in propagation component 310 is forwarded to data propagation component 320. In one embodiment, one input of data propagation component 320 is a data input, one input of data propagation component 320 is a resulting out put from scan in propagation component 310 and the output of data propagation component 320 (M) is forwarded to the recirculation path.

The components of exemplary latch system 300 co-operatively operate to provide efficient latching. Scan in propagation component 310 receives a scan input and a recirculation value. Scan in propagation component 310 is operable to select between a scan in value (SI) and a recirculation value (M). The scan in propagation component 310 selects between a scan in value and a recirculation value based upon an indication from control component 330. Data propagation component 320 receives a data value (D) and results forwarded from the scan in propagation component. Data propagation component 320 is operable to select between a data value and results forwarded from the scan in propagation component, wherein results of the data propagation component are forwarded as the recirculation value to the scan in propagation component. Data propagation component 320 selects between a data value and results forwarded from the scan in propagation component based upon an indication from control component 330. Control component 330 is operable to control an indication of a selection by the scan in propagation component and the data propagation component. The control component receives a scan enable signal (SE) and a clock signal (CLK).

In one embodiment, the data propagation component is operable to pass input data without a delay associated with the scan in component. In one exemplary implementation, the scan in component and data propagation component are operable to introduce a delay to scan input. The scan in propagation component can be configured in the recirculation path of data propagation component. The control component can include a gated clock. In one embodiment, the scan in propagation component includes a multiplexer and the data propagation component includes a multiplexer. The scan in propagation component can be included in a keeper or recirculation path.

Figure 9:
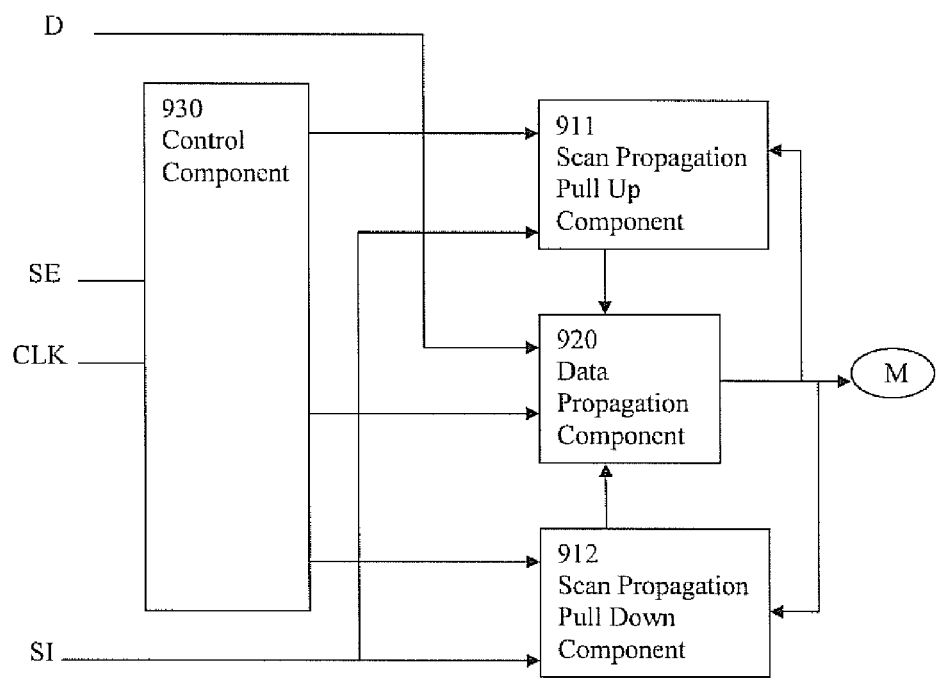
FIG. 9 is a block diagram of an exemplary scan latch system in accordance with one embodiment of the present invention.

FIG. 9 is a block diagram of exemplary latch system 900 in accordance with one embodiment of the present invention. Latch system 900 includes scan in pull up propagation component 911, scan in pull down propagation component 912, data propagation component 920 and control component 930. Control component 930 is coupled to scan in pull up propagation component 911, scan in pull down propagation component 912, and data propagation component 920. In one embodiment, one input of scan in pull up propagation component 911 and scan in pull down propagation component 912 is a scan input and one input of scan in pull up propagation component 911, scan in pull down propagation component 912 is a recirculation value and the output of scan in pull up propagation component 911 and scan in pull down propagation component 912, is forwarded to data propagation component 920. In one embodiment, one input of data propagation component 920 is a data input, one input of data propagation component 920 is a resulting output from scan in pull up propagation component 911 and scan in pull down propagation component 912 and the output of data propagation component 920 (M) is forwarded to the recirculation path.

The components of exemplary latch system 900 co-operatively operate to provide efficient latching. In one embodiment, the components of exemplary latch system 900 co-operatively operate similar to components of latch system 300. In latch system 900, the scan pull up and scan pull down are in separate recirculation paths. Data propagation component 920 is operable to select between a data value and results forwarded from the respective scan in pull up propagation component 911 or scan in pull down propagation component 912, wherein results of the data propagation component are forwarded as the recirculation value to the scan in propagation component.

It is appreciated that presented systems and methods can perform operations more efficiently than conventional approaches. In one embodiment, a present system can propagate data through a scan latch or flip flop faster than conventional approaches. In one exemplary implementation, a present system can propagate data through a scan latch or flip flop without having to go through a conventional scan MUX delays (e.g., associated with scan MUX 110, etc.). In one exemplary implementation, a present system can propagate data through a scan latch or flip flop without as many parasitics as a conventional scan MUX (e.g., parasitics associated with transmission gates 15, 25, etc.). In one exemplary implementation, present system components (e.g., 310, 911, 912, etc.) can introduce a timing adjustment (e.g., delay, hold time, etc.) to the scan in operations.

FIG. 4 is an exemplary latch method 400 in accordance with one embodiment of the present invention.

In block 410, a scan enable indication is received. In one embodiment, the scan enable indication indicates if the latch is supposed to operate in scan mode or not. In one exemplary implementation, when not operating in scan mode a data value is propagated.

In block 420, a selection between a scan input and a recirculation value is made before choosing between a corresponding data input and results of the selecting. In one embodiment, a scan input is delayed by another component before forwarding to another latch when a choice is the scan input. In one exemplary implementation, the selecting is performed in a recirculation path.

In block 430, a choice between the corresponding data input and the results of the selecting is made. In one embodiment, data input is forwarded directly to another latch without another component delay when a choice is the data input. In one exemplary implementation the choice of a data input is not subjected to parasitics associated with a selection between a scan input and a recirculation.

Figure 5:
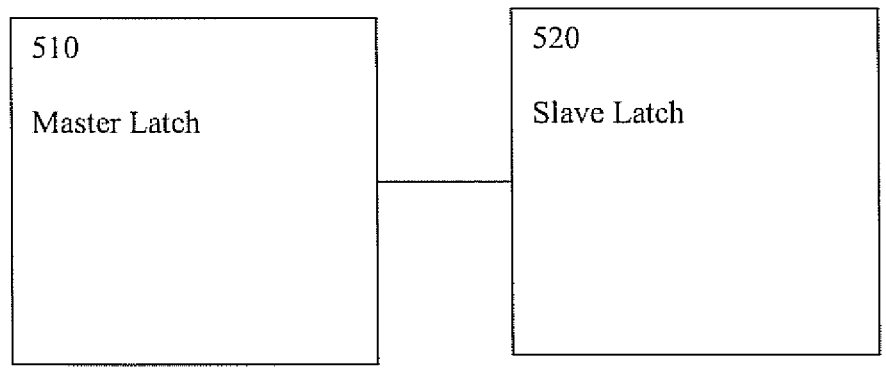
FIG. 5 is a block diagram of exemplary master slave scan flip flop in accordance with one embodiment of the present invention.

The latch method 400 can include a variety of additional features. FIG. 5 is a block diagram of exemplary scan flip flop 500 in accordance with one embodiment of the present invention. Scan flip flop 500 includes a master latch 510 and a slave latch 520. Master latch 510 is coupled to slave latch 520. The components of scan flip flop 500 cooperatively operate to perform efficient scan flip flop functions. Master latch 510 passes data input without delay associated with scan input. Slave latch 520 holds a value forwarded from the master latch 510.

In one embodiment, the master latch 510 introduces a delay to a scan input value before passing it on the slave latch. In one exemplary implementation, the master latch 510 is operable to make a selection between a scan in and a recirculation value and the selection is made in the recirculation path. In one embodiment, a data input is not subjected to parasitics associated with a selection between a scan input and a recirculation while a scan input is subjected to parasitics associated with a selection between a recirculation.

Figure 6:
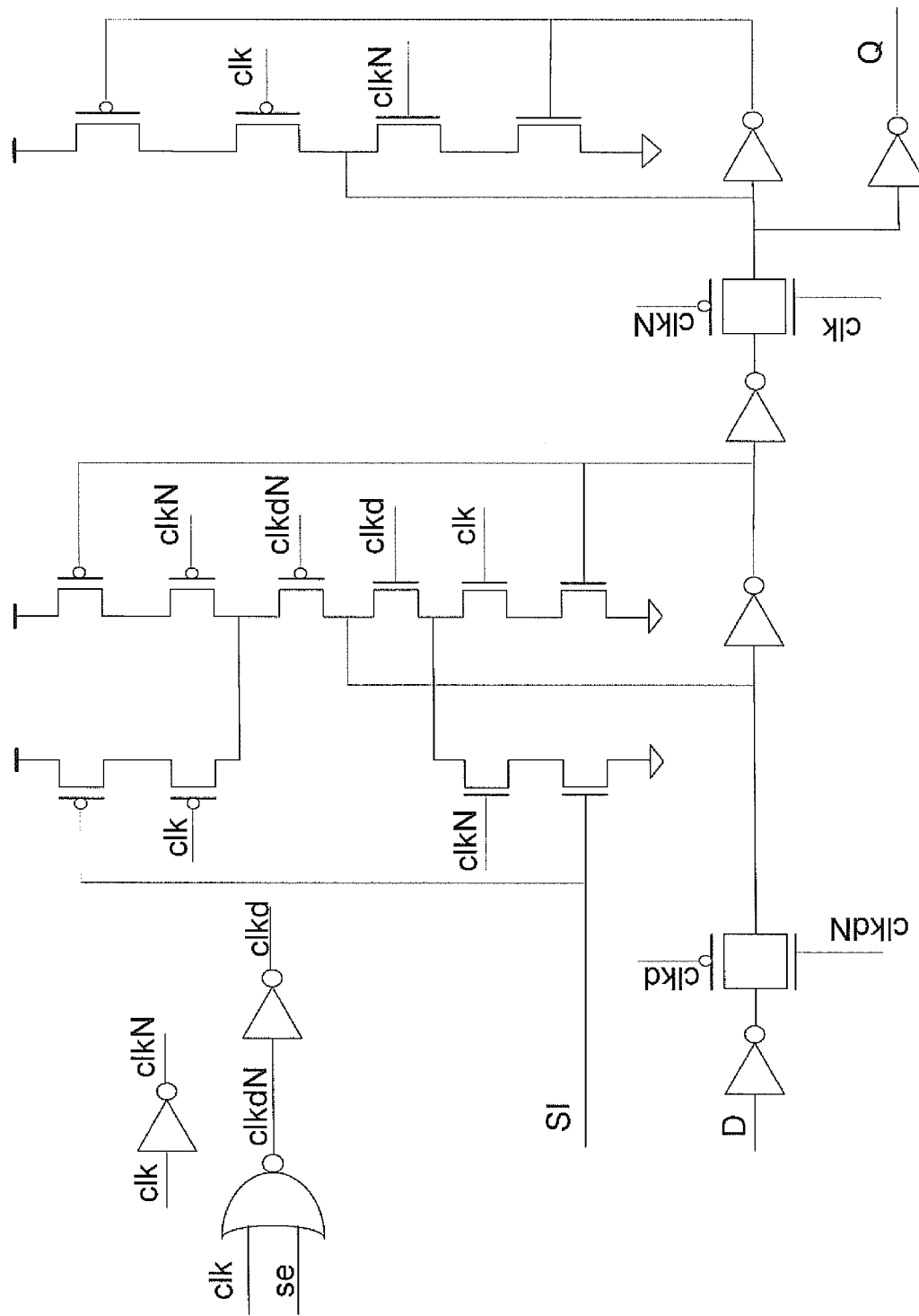
FIG. 6 is a block diagram of exemplary master slave scan flip flop in accordance with one embodiment of the present invention.

FIG. 6 is a block diagram of exemplary master flip flop 600 with ungated clock used to select between a scan in and a recirculate value in accordance with one embodiment of the present invention.

Figure 7:
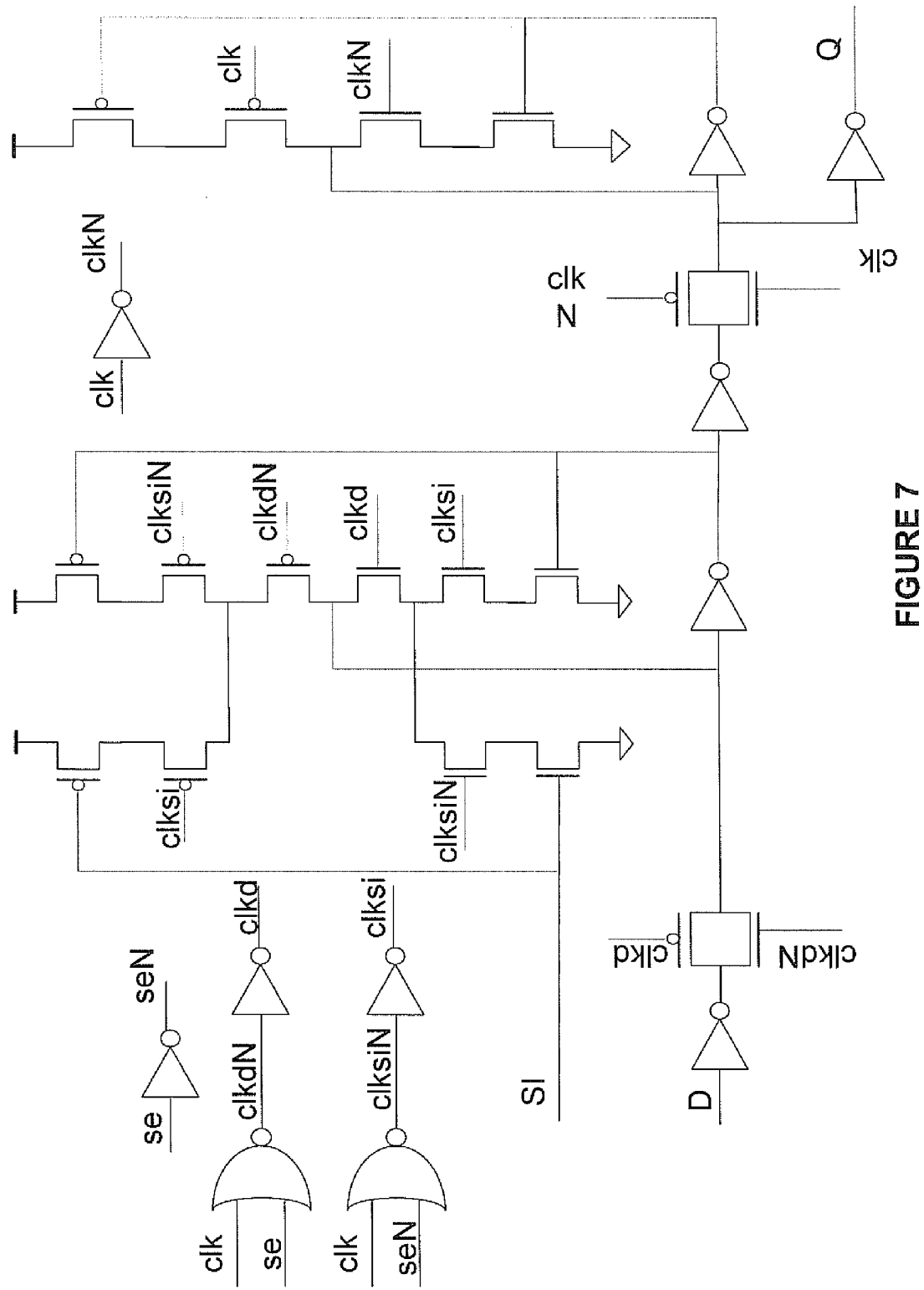
FIG. 7 is a block diagram of exemplary master slave scan flip flop with a gated clock in accordance with one embodiment of the present invention.

FIG. 7 is a block diagram of exemplary master flip flop 700 with a gated clock used to select between a scan in and a recirculate value in accordance with one embodiment of the present invention.

Figure 8:
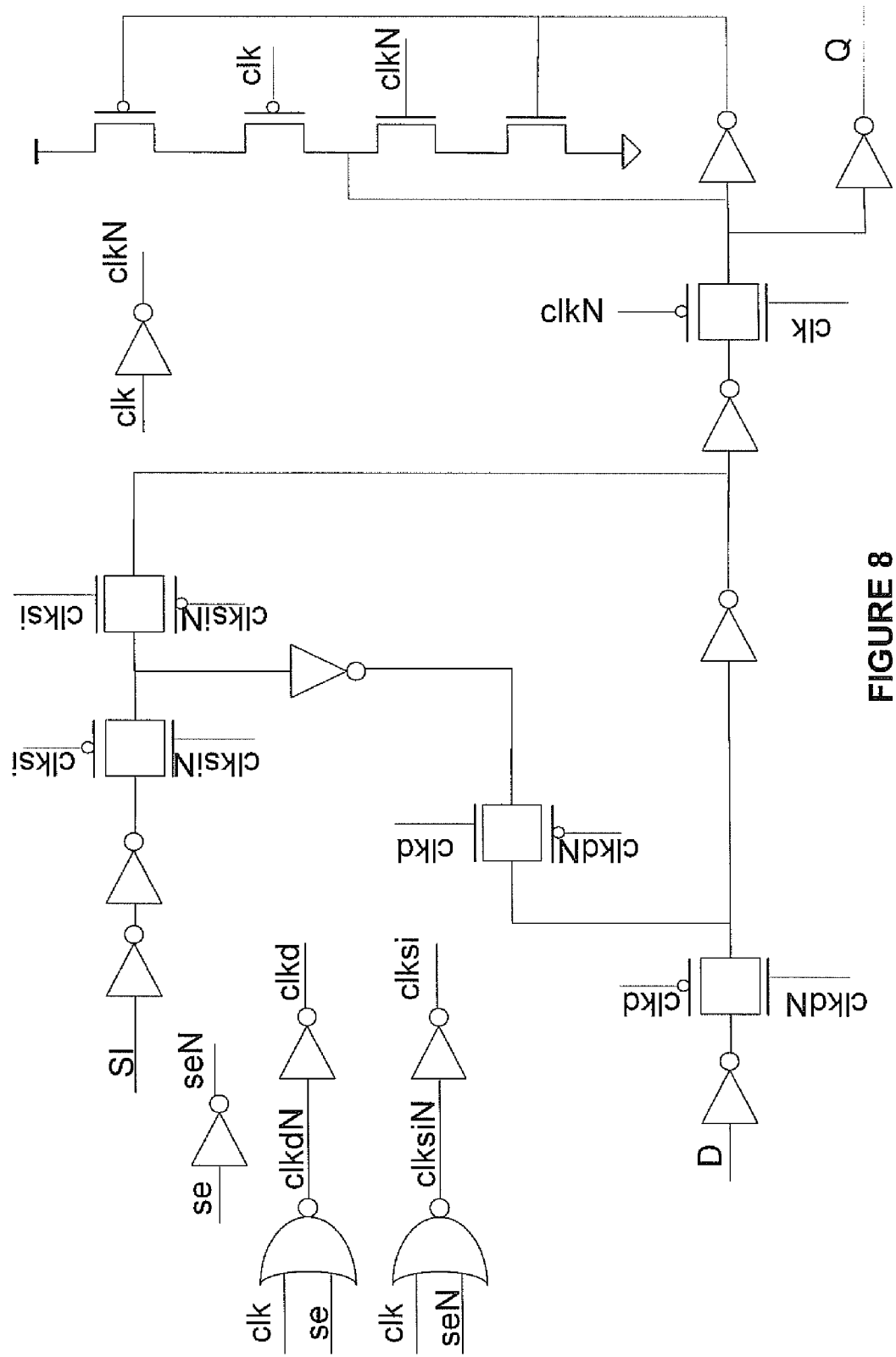
FIG. 8 is a block diagram of exemplary master slave scan flip flop in accordance with one embodiment of the present invention.

FIG. 8 is a block diagram of exemplary master flip flop 800 in accordance with one embodiment of the present invention.

Figure 10:
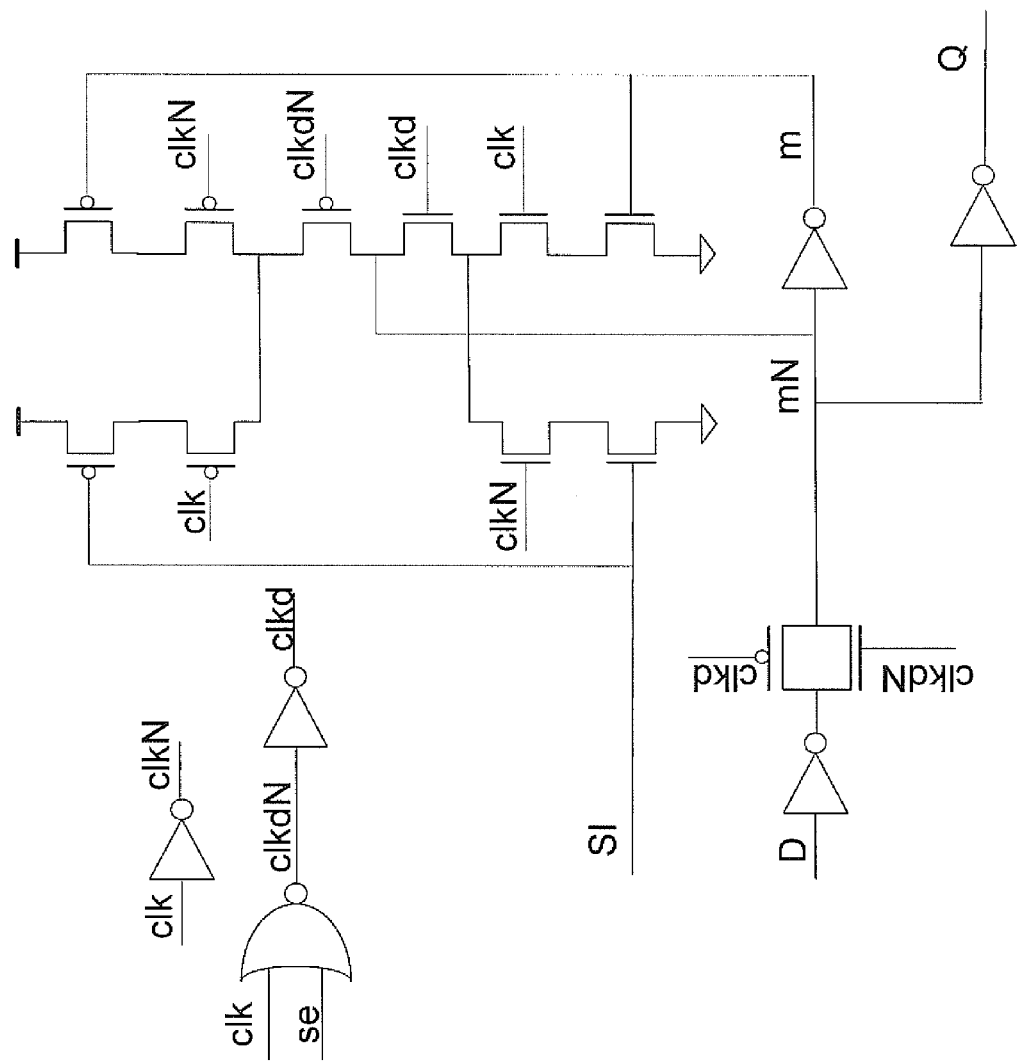
FIG. 10 is a block diagram of an exemplary low phase scan latch in accordance with one embodiment of the present invention.

FIG. 10 is a block diagram of an exemplary low phase scan latch in accordance with one embodiment of the present invention.

Figure 11:
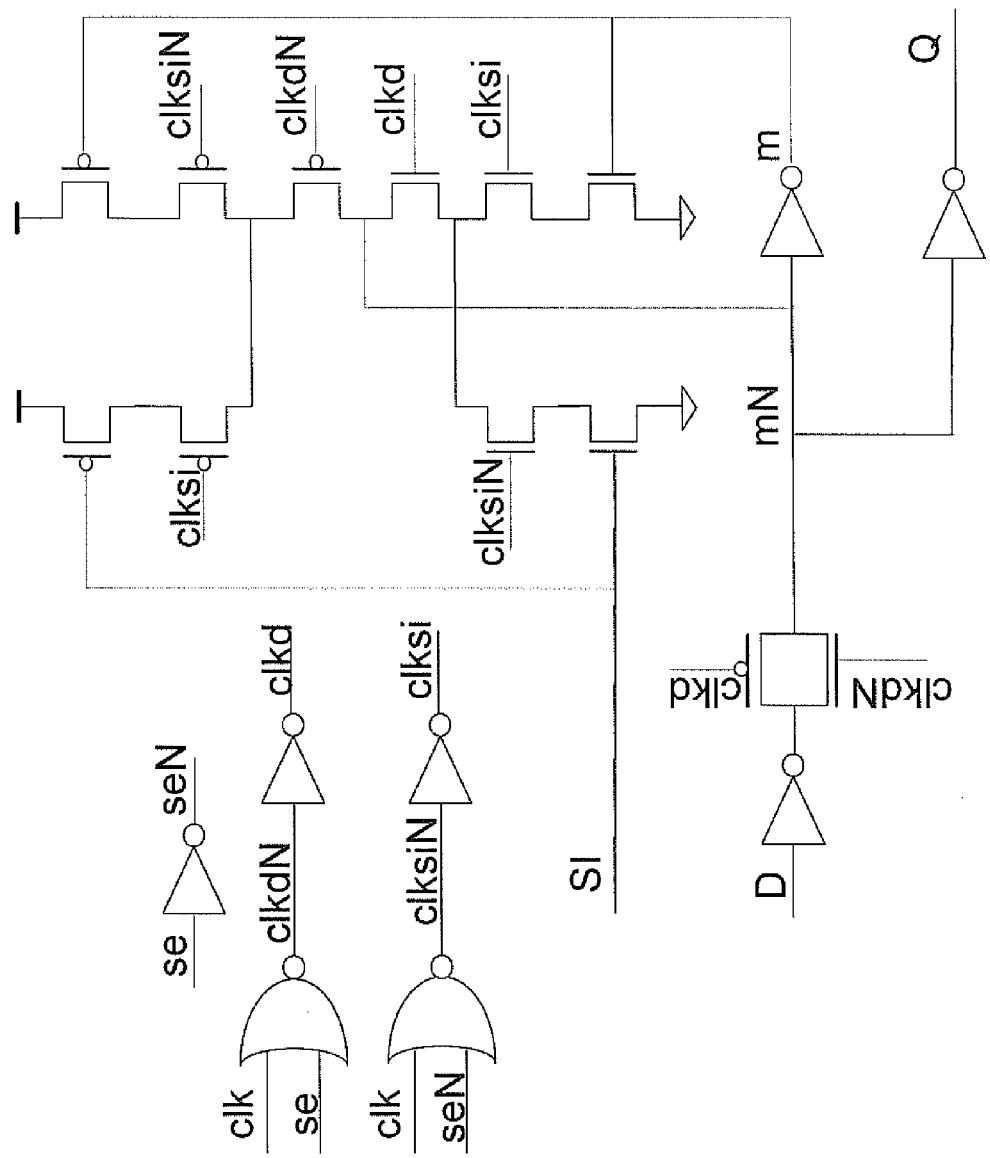
FIG. 11 is a block diagram of an exemplary low phase scan latch with a gated clock used to select between a scan in and a recirculate value in accordance with one embodiment of the present invention.

FIG. 11 is a block diagram of an exemplary low phase scan latch with a gated clock used to select between a scan in and a recirculate value in accordance with one embodiment of the present invention.

Figure 12:
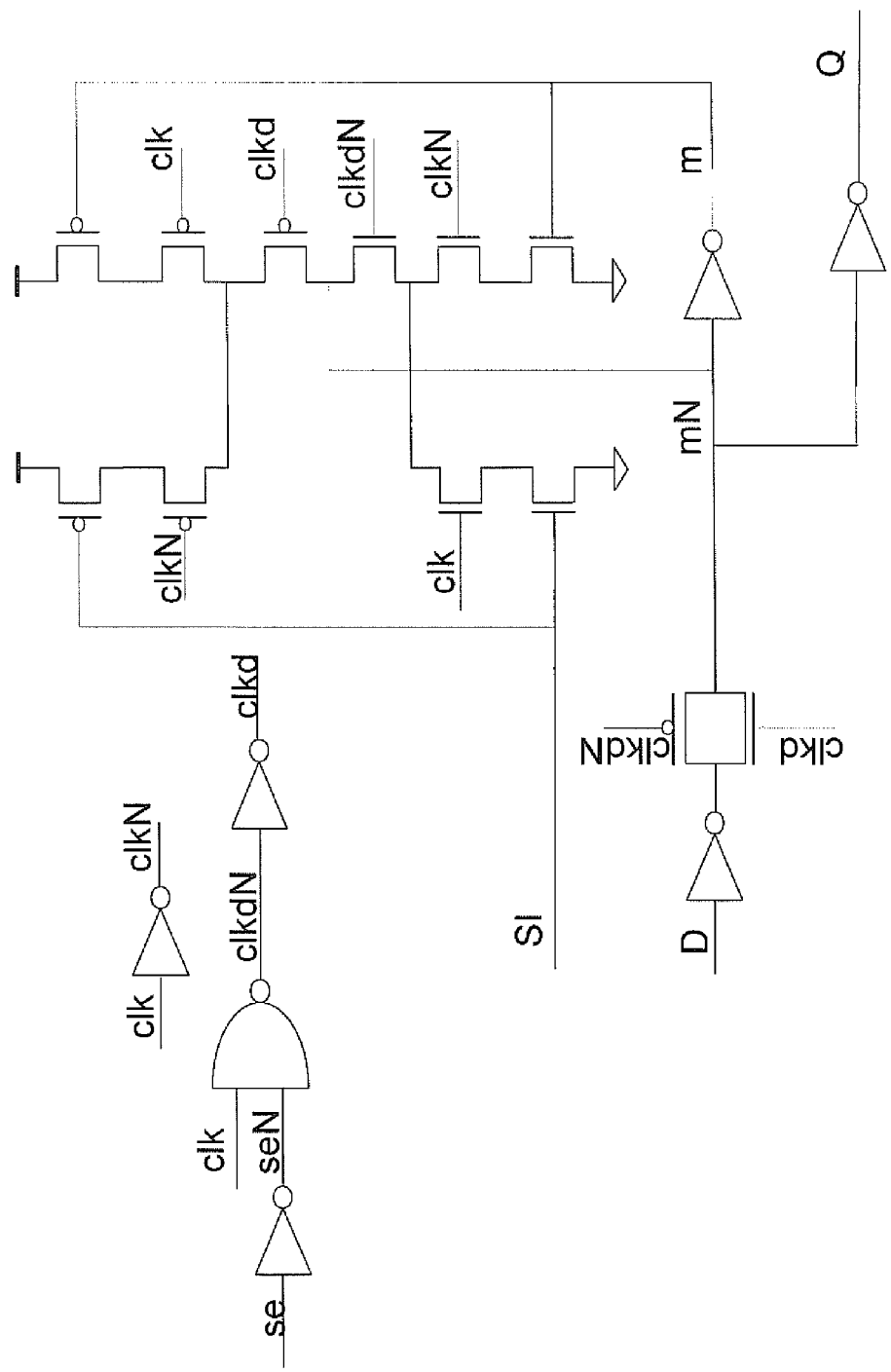
FIG. 12 is a block diagram of an exemplary high phase scan latch in accordance with one embodiment of the present invention.

FIG. 12 is a block diagram of an exemplary high phase scan latch in accordance with one embodiment of the present invention.

Figure 13:
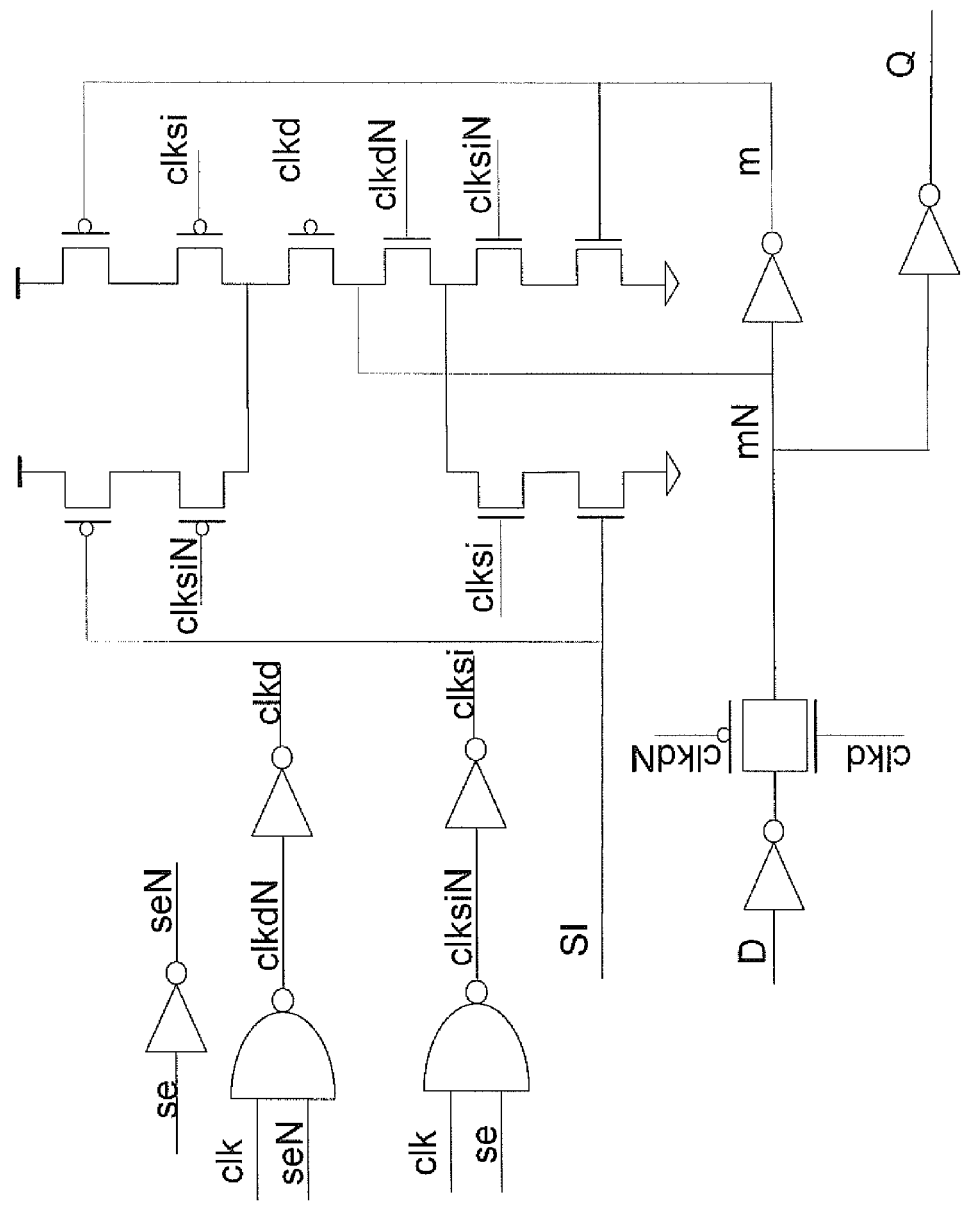
FIG. 13 is a block diagram of an exemplary high phase scan latch with a gated clock used to select between a scan in and a recirculate value in accordance with one embodiment of the present invention.

FIG. 13 is a block diagram of an exemplary high phase scan latch with a gated clock used to select between a scan in and a recirculate value in accordance with one embodiment of the present invention.

Thus, present invention systems and methods provide efficient and effective data and scan functions. In one embodiment, the present systems and methods enable rapid data propagation. In one exemplary implementation, present systems and methods enable data propagation more efficiently than through than conventional approaches (e.g., fewer stages, fewer parasitics, etc.). In one embodiment, the present systems and methods enable desirable scan in delays. In one exemplary implementation, present systems and methods enable scan in propagation more efficiently than through than conventional approaches (e.g., appropriate hold times, longer hold times, etc.).

It is appreciated that the present invention can be implemented in a variety of embodiments. In one exemplary implementation the present invention can be utilized in processing systems utilized to provide a variety of graphics applications including video games. For example, the present invention can be utilized in a game console, personal computer, personal digital assistant, cell phone or any number of platforms for implementing a video game. It is also appreciated that references to video game application implementations are exemplary and the present invention is not limited to these implementations.

Portions of the detailed description are presented and discussed in terms of a method. Although steps and sequencing thereof are disclosed in figures herein describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed within a computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "processing", "computing", "calculating", "determining", "displaying", "accessing," "writing," "including," "storing," "transmitting," "traversing," "associating," "identifying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Some embodiments may be described in the general context of computer-executable instructions, such as program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A circuit comprising:
   a scan in propagation component operable to select between a scan in value and a recirculation value;
   a data propagation component operable to select between a data value and results forwarded from the scan in propagation component, the data value is independent of the scan in value, wherein results of the data propagation component are forwarded as the recirculation logical value that is received at the scan in propagation component; and
   a control component for controlling an indication of a selection by the scan in propagation component and the data propagation component.

2. The circuit of claim 1 wherein the data propagation component is operable to pass input data while avoiding a delay associated with the scan in component.

3. The circuit of claim 1 wherein the scan in component and data propagation component are operable to introduce a delay to scan input.

4. The circuit of claim 1 wherein the scan in propagation component is configured in the recirculation path of data propagation component.

5. The circuit of claim 1 wherein the control component includes a gated clock.

6. The circuit of claim 1 wherein the scan in propagation component includes a multiplexer and the data propagation component includes a multiplexer.

7. The circuit of claim 1 wherein the scan in propagation component is included in a keeper.

8. A method comprising: receiving a scan enable indication; selecting between a scan input and a recirculation value before choosing between a corresponding data input and results of the selecting, wherein results of a data propagation component are forwarded as the recirculation logical value of the scan input and the data input is independent of the scan input; and
   choosing between the corresponding data input and the results of the selecting.

9. The method of claim 8 wherein data input is forwarded directly to another latch while avoiding another component delay when a choice is the data input.

10. The method of claim 8 wherein scan input is delayed by another component before forwarding to another latch when a choice is the scan input.

11. The method of claim 8 wherein the selecting is performed in a recirculation path.

12. The method of claim 8 wherein the choice of a data input avoids subjection to a parasitic load associated with a selection between a scan input and a recirculation.

13. The method of claim 8 further comprising controlling said selecting with a gated clock signal.

14. The method of claim 8 wherein a scan input is forwarded through more multiplexers then a data input.

* * * * *